(12) United States Patent
Meissner et al.

(10) Patent No.: US 11,114,258 B2
(45) Date of Patent: Sep. 7, 2021

(54) SWITCHING APPARATUS FOR CARRYING AND DISCONNECTING ELECTRIC CURRENTS, AND SWITCHGEAR HAVING A SWITCHING APPARATUS OF THIS KIND

(71) Applicant: Eaton Intelligent Power Limited, Dublin (IE)

(72) Inventors: Johannes Meissner, Bonn (DE); Gerd Schmitz, Niederkassel (DE); Kai Schroeder, Niederkassel (DE); Michael Wohlang, Bornheim (DE); Oliver Kreft, Bonn (DE); Marcel Uedelhoven, Blankenheim (DE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 16/765,491

(22) PCT Filed: Nov. 20, 2018

(86) PCT No.: PCT/EP2018/081941
§ 371 (c)(1),
(2) Date: Aug. 3, 2020

(87) PCT Pub. No.: WO2019/101744
PCT Pub. Date: May 31, 2019

(65) Prior Publication Data
US 2020/0365347 A1    Nov. 19, 2020

(30) Foreign Application Priority Data

Nov. 24, 2017   (DE) ..................... 10 2017 127 886.9

(51) Int. Cl.
*H01H 9/54*     (2006.01)
*H01H 9/30*     (2006.01)
(Continued)

(52) U.S. Cl.
CPC .............. *H01H 9/542* (2013.01); *H01H 9/30* (2013.01); *H01H 33/59* (2013.01); *H03K 17/56* (2013.01)

(58) Field of Classification Search
CPC ............. H01H 9/542; H01H 2009/546; H01H 2009/545; H01H 2009/543;
(Continued)

(56) References Cited

U.S. PATENT DOCUMENTS 4,420,784 A * 12/1983 Chen ........................ H01H 9/30
361/13
4,598,330 A *  7/1986 Woodworth ........... H01H 9/542
361/13
(Continued)

FOREIGN PATENT DOCUMENTS

DE   102013114259 A1   6/2015
DE   102016106414 A1  10/2017
(Continued)

*Primary Examiner* — Patrick C Chen
(74) *Attorney, Agent, or Firm* — Leydig, Voit & Mayer, Ltd.

(57) ABSTRACT

A switching apparatus for carrying and disconnecting electric currents includes: a first mechanical contact arrangement; a second mechanical contact arrangement which is connected in series with the first mechanical contact arrangement; a semiconductor switch which is connected in parallel to the first mechanical contact arrangement; a switching electronics system for switching on and switching off the semiconductor switch; and a control circuit for ascertaining a voltage across the first mechanical contact arrangement as an ascertained voltage and generating an actuation signal for the switching electronics system, which actuation signal switches on the semiconductor switch, depending on the ascertained voltage. During a switching (Continued)

process, the switching apparatus closes the two mechanical contact arrangements with a time delay in relation to one another.

11 Claims, 4 Drawing Sheets

(51) Int. Cl.
*H01H 33/59* (2006.01)
*H03K 17/56* (2006.01)

(58) Field of Classification Search
CPC .... H01H 2009/544; H01H 9/541; H01H 9/30; H01H 9/32; H01H 9/34; H01H 9/341; H01H 9/345; H01H 9/346; H01H 9/302; H01H 2009/305; H01H 2009/307; H01H 2009/343; H01H 2009/347; H01H 2009/348; H01H 2009/365; H01H 2009/367; H01H 9/38–465; H01H 33/59; H01H 33/593; H01H 33/596; H03K 17/56; H03K 17/567

See application file for complete search history.

(56) References Cited

U.S. PATENT DOCUMENTS

| | | |
|---|---|---|
| 2016/0322184 A1 | 11/2016 | Meissner et al. |
| 2019/0131966 A1 | 5/2019 | Kreft et al. |

FOREIGN PATENT DOCUMENTS

| | | |
|---|---|---|
| DE | 102016108246 A1 | 11/2017 |
| EP | 0011958 A1 | 6/1980 |
| EP | 0179982 A2 | 5/1986 |
| EP | 3057117 A1 | 8/2016 |
| WO | WO 2017174326 A1 | 10/2017 |

* cited by examiner

SWITCHING APPARATUS FOR CARRYING AND DISCONNECTING ELECTRIC CURRENTS, AND SWITCHGEAR HAVING A SWITCHING APPARATUS OF THIS KIND

CROSS-REFERENCE TO PRIOR APPLICATIONS

This application is a U.S. National Phase application under 35 U.S.C. § 371 of International Application No. PCT/EP2018/081941, filed on Nov. 20, 2018, and claims benefit to German Patent Application No. DE 10 2017 127 886.9, filed on Nov. 24, 2017. The International Application was published in German on May 31, 2019 as WO 2019/101744 under PCT Article 21(2).

FIELD

The present disclosure relates to a switching apparatus for carrying and disconnecting electric currents, in particular a hybrid switching arrangement for carrying and disconnecting high DC currents and low-frequency AC currents, and a switching device having such a switching apparatus.

BACKGROUND

The German published patent application DE 10 2013 114 259 A1 describes an advantageous variant of a hybrid switching arrangement in which the current load on the power semiconductor is minimized in time in order to achieve the longest possible life expectancy and the smallest possible dimensioning, which is particularly important for power contactors in the current range of a few hundred amperes. To minimize the time for the load current flowing through the power semiconductor, the commutation time is detected via a current transformer and the current flow through the semiconductor is only maintained until the mechanical switching path that has opened has reached sufficient electrical strength. In this short time, the load current through the semiconductor is artificially led to zero via its control so that, after opening of both the quenching contact arrangement and the isolating contact arrangement connected in series for this purpose, a safe galvanic isolation is achieved.

When designing a switching device, an important task is to prevent welding of the switching contacts in order to ensure functional reliability and to achieve a long electrical service life. In principle, even when using a suitable contact material and with a sufficient contact size, there is a risk that the contacts will recoil briefly during the switch-on process, especially for switching devices for currents in the range of a few hundred amperes, for which comparatively high contact pressure forces are required. In such a recoil process, an arc is briefly formed between the minimally opened contacts. In particular in the case of high arc currents, local melting of the contact surfaces can occur in the region of the base points, which then leads to the two contacts being welded when the contact is made again immediately afterwards. In this case the tendency to weld increases in particular in the case of such contacts whose surfaces already have a greatly changed topography as a result of numerous switching operations subject to arcing. Spot welds preferably occur in the region of contact tips. If it is not possible to break up such welding again with the aid of the switch drive during the subsequent switch-off process, the switching device is no longer operational. In principle, this also applies to hybrid switches. If, for example, the so-called erase contacts are welded when the hybrid switching arrangement described in German published patent application DE 10 2013 114 259 A1 is switched on, the subsequent deactivation process can no longer result in commutation to the power semiconductor, which is made possible by the mechanical opening of the erase contacts. In the absence of commutation of the load current to the IGBT, the hybrid switch loses its basic function of leading the load current through the semiconductor to zero there for a short time. When the second mechanical contact arrangement, which is responsible for the galvanic isolation of the hybrid switch, is opened, a permanent arc can then be formed and thus the switching device can be destroyed.

German published patent application DE 10 2016 106 414 A1 describes a hybrid switching arrangement which can be used to prevent contact welding when high currents are switched on by means of a targeted control modification, in order thereby to achieve increased functional reliability and the longest possible electrical service life. The principle of operation of this arrangement is that the power semiconductor is already in the switched-on state before the first mechanical contact is made, so that during the subsequent phase of mechanical bounce-back of the switch contacts it carries the load current whenever the switch contacts are open for a short time. At the end of the recoil phase, the current is routed permanently via the closed contacts and the IGBT is switched to the blocking state.

In this way it is possible to avoid the arcing during the contact bouncing phase, which as a result can lead to welding of the switching contacts and thus to possible failure of the switching device.

U.S. Pat. No. 4,420,784 discloses a hybrid switching arrangement in which the voltage and the current flow across one of two mechanical contact arrangements connected in series are measured during the opening of one of the contact arrangements. If the measured current and the measured voltage reach a predetermined ratio, a control logic activates a driver circuit with regard to which power FETs, connected in parallel to the opened mechanical contact arrangement, are to be switched through.

SUMMARY

In an embodiment, the present invention provides a switching apparatus for carrying and disconnecting electric currents, comprising: a first mechanical contact arrangement; a second mechanical contact arrangement which is connected in series with the first mechanical contact arrangement; a semiconductor switch which is connected in parallel to the first mechanical contact arrangement; a switching electronics system configured to switch on and switch off the semiconductor switch; and a control circuit configured to ascertain a voltage across the first mechanical contact arrangement as an ascertained voltage and to generate an actuation signal for the switching electronics system, which actuation signal switches on the semiconductor switch, depending on the ascertained voltage, wherein the switching apparatus is configured such that during a switching process the two mechanical contact arrangements are closed with a time delay in relation to one another.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
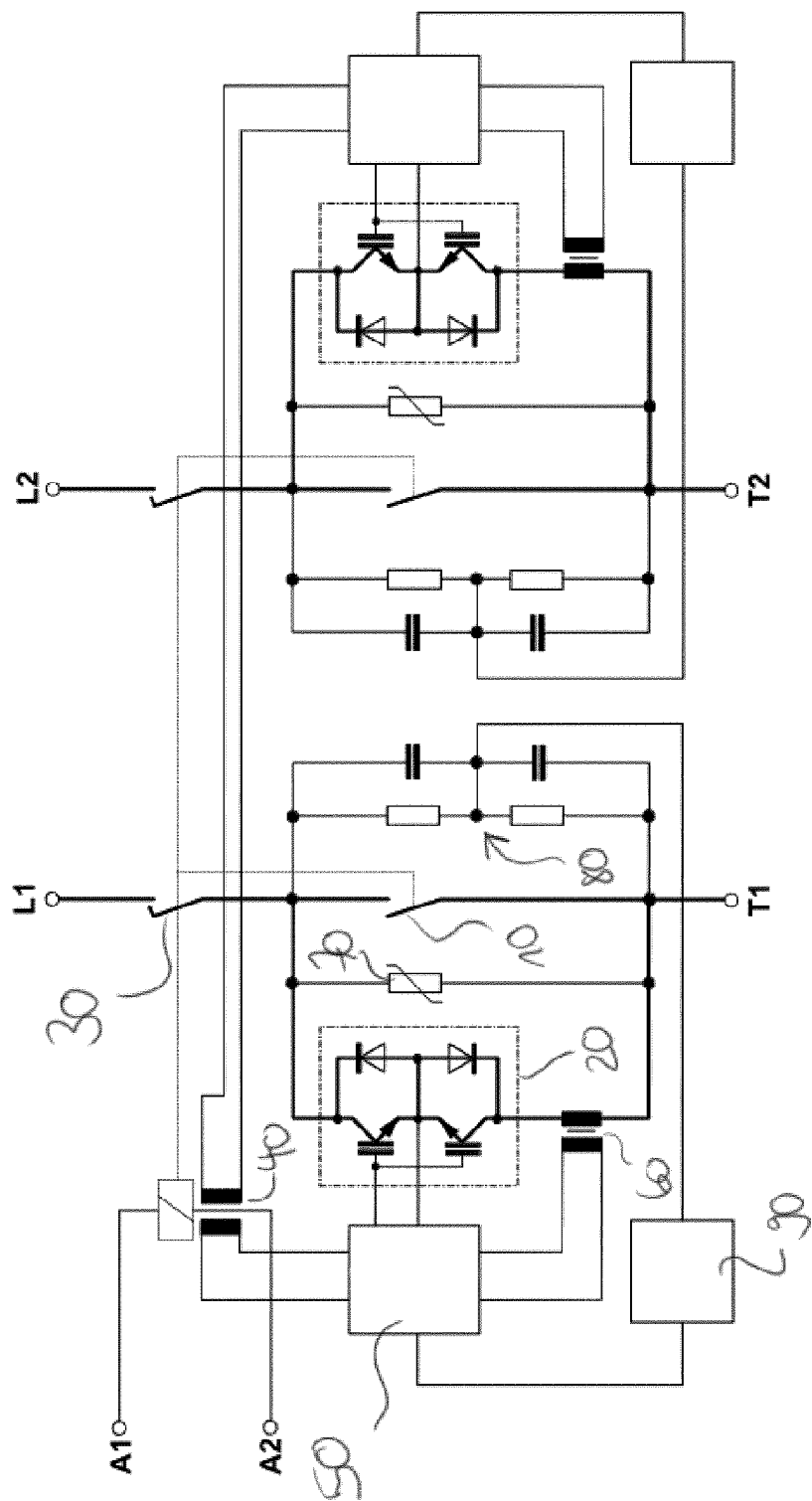
FIG. 1 shows a block diagram of an exemplary embodiment of a switching device with a double contact arrangement.

Apparatuses and devices are described below in which the risk of formation of undesired switching arcs is reduced and as a result increased functional reliability and the longest possible electrical service life can be achieved.

In an embodiment, the present invention provides a switching apparatus for carrying and disconnecting electrical currents is disclosed, comprising a first mechanical contact arrangement, a second mechanical contact arrangement which is connected in series with the first mechanical contact arrangement, a semiconductor switch which is connected in parallel with the first mechanical contact arrangement, and a switching electronics system which is designed to switch on and switch off the semiconductor switch, wherein the switching apparatus is designed in such a way that, during a switching process, the two mechanical contact arrangements are closed with a time delay in relation to one another, and wherein a control circuit is provided which is designed to ascertain a voltage across the first mechanical contact arrangement and to generate an actuation signal for the switching electronics system, which actuation signal switches on the semiconductor switch, depending on the ascertained voltage. To control the semiconductor switch, the voltage ratios across the series circuit are used by two mechanical contact arrangements which are closed with a time delay relative to one another. In this switching apparatus, electronic switch-on support is therefore implemented, which is used when the mechanical contact arrangements are closed with a time delay and helps to reduce or even avoid arcing, in particular as a result of switch-on bounces of a mechanical contact arrangement. By monitoring of the voltage state on the first mechanical contact arrangement, a control of the semiconductor switch that is better adapted thereto in terms of time can be implemented. In particular, tolerances, for example caused by heating of a coil in the drive, tolerances of strokes and/or friction in the switching mechanism, tolerances due to the position of use, can be taken into account, in contrast to a predetermined switch-on time of the semiconductor switch, which must be dimensioned in such a way that there is a sufficiently great advance when the semiconductor switch is switched on due to all tolerances which may possibly occur.

In particular, the control circuit can determine a drop in the voltage present across the first mechanical contact arrangement. The drop in the voltage thus triggers the generation of the actuation signal for the switching electronics system. A negative voltage edge can be determined, for example, as a drop in the voltage applied across the first mechanical contact arrangement, in particular a drop in the voltage within a predetermined time period, for example a drop of more than 50% of a predetermined voltage within a few milliseconds. The negative voltage edge can be detected dynamically using a capacitor.

Furthermore, the control circuit can be designed to generate the actuation signal for the switching electronics system when the determined voltage falls below a predetermined threshold value. The predefined threshold value can, for example, be selected depending on the voltage ratios across the series connection of the mechanical contact arrangements such that it is somewhat lower than the voltage when the second contact arrangement is closed, so that when the first contact arrangement is closed, the voltage drops below the predetermined threshold value and thus the control circuit can generate the actuation signal.

The control circuit can be designed, in particular, to generate the actuation signal for the switching electronics system in such a way that the semiconductor switch is switched on after a predetermined period of time. As a result, the current load on the semiconductor switch can be reduced.

The predetermined time period can be selected depending on the mechanical switch-on behavior of the first mechanical contact arrangement and/or on the current carrying capacity of the semiconductor switch. For example, it can be selected such that the semiconductor switch is only switched on shortly after or almost simultaneously with the first contacting operation of the first mechanical contact arrangement, and the current load on the semiconductor switch is therefore as short as possible in time.

The control circuit can have a switch and a low-pass filter connected upstream of it, wherein the switch generates the actuation signal for the switching electronics system. The low-pass filter can be used to define a delay in the generation of the actuation signal and thus the switching on of the semiconductor switch, in particular by the time constant of the low-pass filter.

The control circuit can have a zener diode connected in parallel with the capacitor of the low-pass filter for voltage limitation.

Furthermore, the control circuit can have a resistor which is connected in parallel with the capacitor of the low-pass filter and which forms a voltage divider with the resistance of the low-pass filter to generate an input voltage suitable for controlling the switch.

The switch can be a normally blocking field-effect transistor, the load path of which is connected in series with a resistor in parallel with the switching electronics system between a supply voltage potential and a reference potential, wherein the switching electronics system is supplied with a voltage potential on the input side for control purposes at the connection of the resistor connected to the supply voltage potential. If the voltage at the control connection of the field-effect transistor drops so that it begins to block, the voltage potential at the connection of the resistor connected to the supply voltage potential increases, so that the switching electronics system can switch on the semiconductor switch.

In an embodiment, the present invention provides a switching device is disclosed, comprising a switching device as discussed above and, as disclosed herein, a switching drive for moving contacts of the first and second mechanical contact arrangement.

In the following description, identical, functionally identical and functionally related elements can be provided with the same reference signs. Absolute values are only given as examples below and are not to be understood as limiting.

FIG. 1 shows the block diagram of a switching apparatus for a 2-pole, polarity-independent switching device. The connections of the switching device for the two poles are designated by L1, T1 and L2, T2, respectively. In terms of circuitry, this switching apparatus largely corresponds to the apparatus described in German patent application DE 10 2013 114 259 A1 and shown therein in FIG. 1. The apparatus described below differs from this known apparatus in the control circuit 90, which is designed for special activation of the semiconductor switch 20, as will be explained in detail in the following description.

For each pole, the switching apparatus shown in FIG. 1 has a parallel connection of a first mechanical (erase) contact arrangement 10 with a semiconductor switch 20 based on an anti-serial IGBT arrangement (power semiconductor), which is connected to a second mechanical (disconnect) contact arrangement 30 for ensuring the galvanic isolation is connected in series (double contact arrangement). The mechanical contact arrangements 10 and 30 can be designed as a bridge switching arrangement of an air switching device or an air switching device arrangement or as a double arrangement of a vacuum interrupter, such as, for example, the interrupter described in German published patent application DE 10 2016 108 246 A1.

The semiconductor switch 20 is switched on or off by the switching electronics system 50, that is to say activated or blocked. The switching electronics system 50 can be supplied with energy stored in the (magnetic drive) coil of the switching or magnetic drive of the switching device. For this purpose, an auxiliary coil 40 is provided which is galvanically separated from the circuit of the switching drive and which can generate a voltage for supplying the switching electronics system 50 when the switching drive is switched off. The auxiliary coil 40 can, for example, be wound around the drive coil.

Additionally or alternatively, the switching electronics system 50 can be supplied by an external electrical energy source, for example from a central energy source for the electrical units of a switch cabinet or via a bus system to which a plurality of switching devices are coupled, and the like.

In the switched-on case, i.e. when the switching drive supplies the magnetic drive coil with a voltage and a current and the contacts of the first and second mechanical contact arrangements 10 and 30 are closed, the semiconductor switch 20 is blocked, in particular since in this state no voltage is generated by the auxiliary coil 40 for supplying the switching electronics system 50 and the switching electronics system 50 is therefore voltage-free and cannot control the IGBTs of the semiconductor switch 20.

At the moment when the voltage and current supply of the magnetic drive coil of the switching drive is switched on to close the contacts of the first and second mechanical contact arrangements 10 and 30, energy is stored in the magnetic drive coil. In the auxiliary coil 40 which is electromagnetically coupled to the magnetic drive coil, the coil current induces a voltage which supplies the switching electronics system 50.

The voltage induced in the auxiliary coil 40 is sufficient, on the one hand, to supply the switching electronics system 50 itself and, on the other hand, to build up the voltage required to actuate the IGBTs. The auxiliary coil 40 offers the advantage that the semiconductor switch can be actuated before the contacts of the first and second mechanical contact arrangements 10 and 30 are closed due to the mechanical inertia.

At the moment when the voltage and current supply of the magnetic drive coil of the switching drive is switched on to close the contacts of the first and second mechanical contact arrangements 10 and 30, an external supply can also be activated in order to activate the switching electronics system 50.

A voltage potential from a node of a voltage divider 80 connected in parallel to the first mechanical contact arrangement 10 is fed to the control circuit 90 already mentioned on the input side. On the basis of this voltage potential, the control circuit 90 determines the voltage across the first mechanical contact arrangement 10 and, as a function thereof, generates an actuation signal for the switching electronics system 50 so that it switches on the semiconductor switch 20, as described in detail below.

Figure 2:
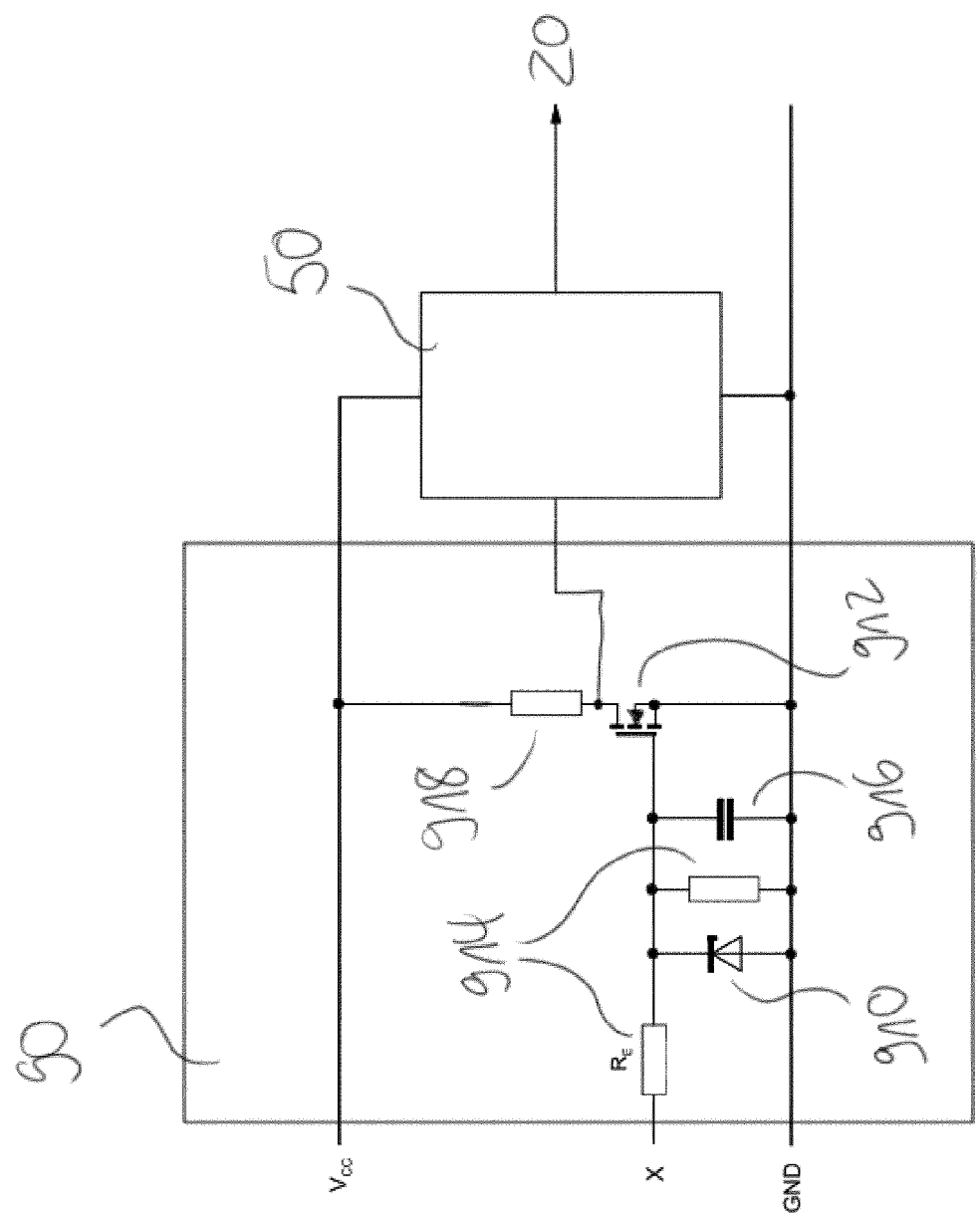
FIG. 2 shows the circuit diagram of the control circuit used in the switching apparatus of FIG. 1.

FIG. 2 shows the control circuit 90 in detail: the voltage potential X on the input side from the node of the voltage divider 80 and present at the node of the voltage divider 80 corresponds to the current voltage across the mechanical contact arrangement. This voltage potential X is limited by a zener diode 910 connected between the input of the control circuit 90 and a reference potential GND. The reference potential GND (ground reference point) corresponds to a voltage potential in the semiconductor switch 20, specifically the voltage potential prevailing at the node of two merged emitter connections of IGBTs of the semiconductor switch 20. A switch 912, for example a field-effect transistor of the enhancement type, is driven by the voltage potential X divided by a voltage divider 914. A capacitor 916 connected between the control connection of the switch 912, for example the gate of a field-effect transistor and the reference potential GND, with the capacitance C serves as a charge store and together with the resistor $R_E$ of the voltage divider 914 as a delay element, by means of which the switching of the switch 912 by the time constant $t=R_E*C$ is delayed. The control path of the switch 912 is connected in series with a (pull-up) resistor 918 for signal adaptation to the switching electronics system 50 between a supply voltage potential Vcc and the reference potential GND.

The switch-on behavior of a double contact arrangement with delayed closing operations of the contact arrangements and a hybrid switch arrangement with switch-on support such as that shown in FIG. 1, which is thereby suitable for frequent switching of high direct currents, will now be described.

In the arrangement shown in FIG. 1, the switch-on operation is initiated by energizing a drive coil of an electromagnetic drive for actuating the mechanical contact arrangements of the switching device. At the same time, the IGBT control electronics system or switching electronics system 50 are supplied with energy. After completion of this initialization operation, the IGBT or semiconductor switch 20 is blocked by the power-on support until the time of the first mechanical contact, which in switching devices for high currents may lie, for example, in the range of approx. 10 milliseconds. This ensures that the load current is not yet carried by the IGBT 20 when the first contact pair of the mechanical contact arrangement 30 is mechanically contacted. In the hybrid arrangement shown in FIG. 1, the mechanical contact arrangements 10, 30 are closed first with the isolating contact arrangement 30, which ensures the galvanic isolation of the hybrid switch after a switch-off operation. The erase contact arrangement 10 is only closed after a time delay of typically a few milliseconds.

Figure 3:
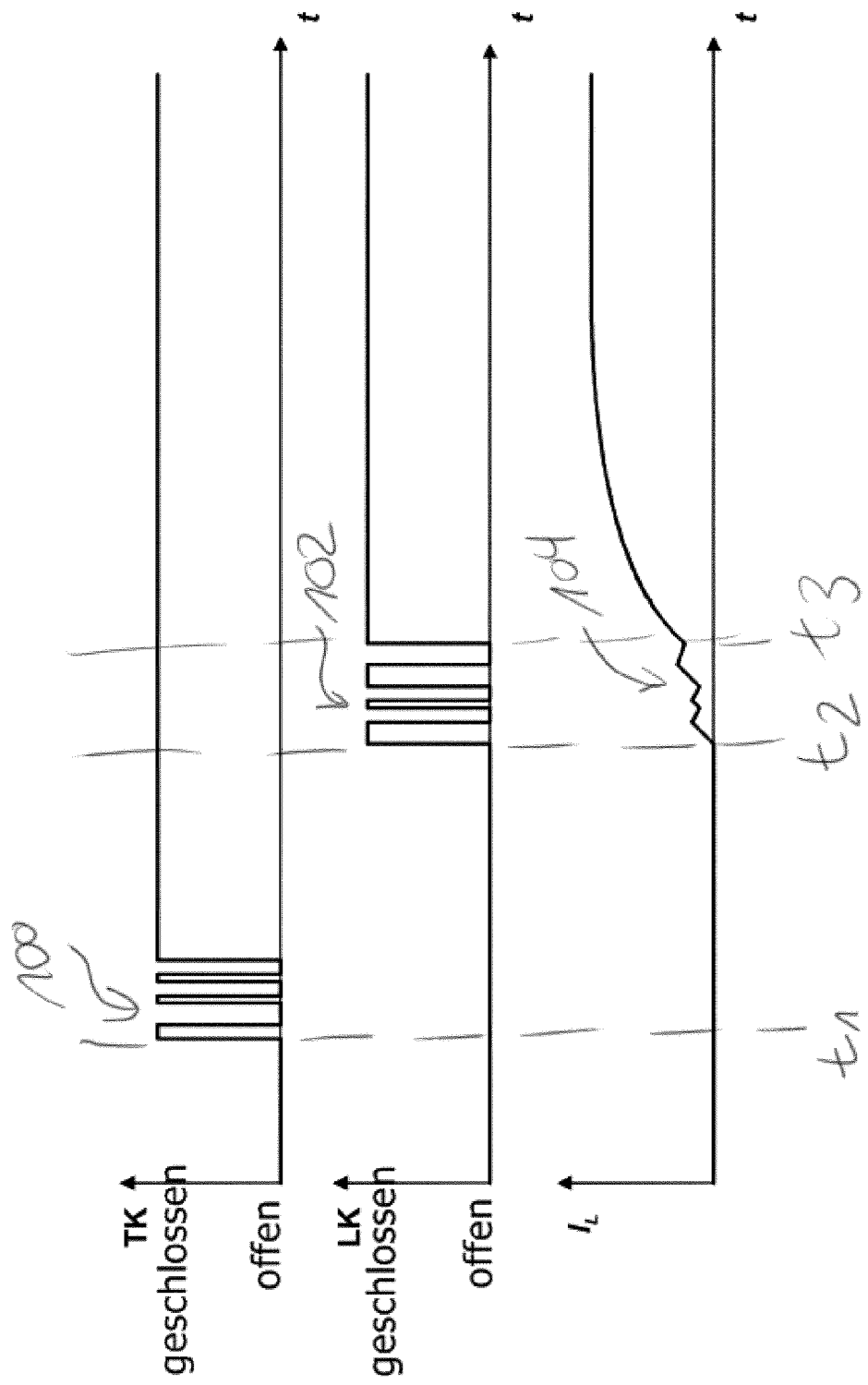
FIG. 3 shows a diagram with the profiles of important signals of an exemplary embodiment of a switching device with a double contact arrangement.

FIG. 3 shows the state of the (disconnect) contact arrangement 30 (profile TK) and the (erase) contact arrangement 10 (profile LK) and the load current $I_L$ through the switched pole in a double contact arrangement comprising a series connection of the first and second mechanical contact arrangements 10, 30. First, the mechanical contact arrangement 30 is closed at the time $t_1$, while the mechanical contact arrangement 10 is still open. Therefore, no load current flows through the switched pole. When the contact arrangement 30 is closed, contact bounces 100 generally occur, which leads to brief opening and closing operations of the contact arrangement 30, but, as a result of the opened contact arrangement 10, generally does not lead to arcing. The contact arrangement 10 is then closed with a delay at the time $t_2$. Contact bounces 102 generally also occur during this closing operation, which in turn leads to brief opening and closing operations of the contact arrangement 10. Since the contact arrangement 30 is already closed in this case, a load current $I_L$ begins to flow when the contact arrangement 10 closes. Contact bouncing 102 and the associated short-term interruptions in the load current path via the switched pole can result in drops 104 in the current flow of the load current $I_L$, as can be seen in the profile of the load current in the diagram during contact bouncing 102. The current flow of the load current $I_L$ via the switched pole only stabilizes after the contact bounce 102 has subsided at the time $t_3$ and the two contact arrangements 10 and 30 have thus closed completely. During contact bouncing 102, arcs can form between the contacts of the contact arrangement 10, which can lead to impairments of the contact capability or even to welding of the contacts of the contact arrangement 10.

Figure 4:
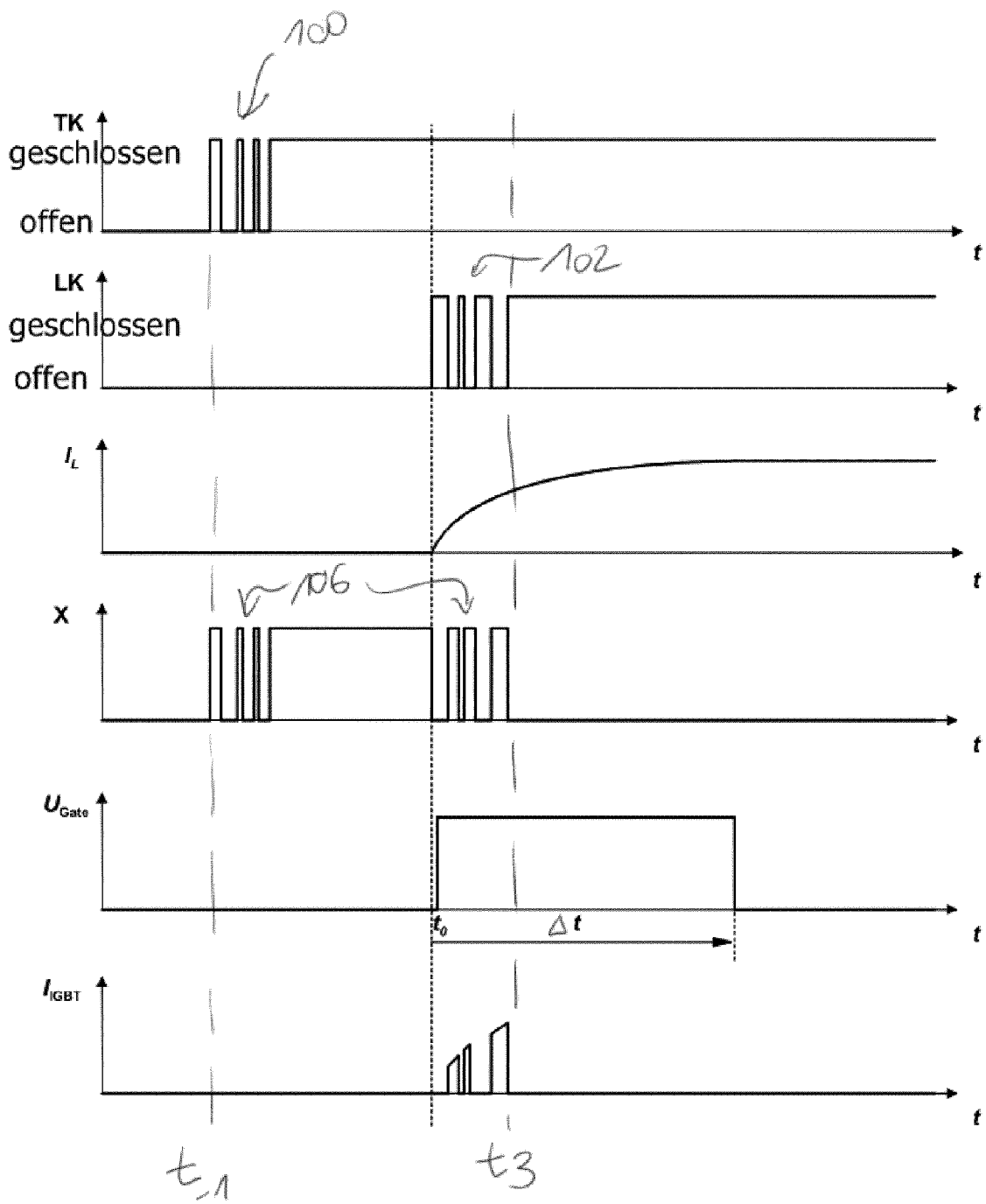
FIG. 4 shows a diagram with the profiles of important signals of an exemplary embodiment of a switching apparatus comprising a double contact arrangement with a control circuit.

FIG. 4 shows the state of the (disconnect) contact arrangement 30 (profile TK) and the (erase) contact arrangement 10 (profile LK) and the load current $I_L$ through the switched pole in the hybrid switching arrangement shown in FIG. 1 with switch-on support, i.e. using the control circuit 90. In addition, the profiles of the voltage potential X, the voltage at the gate of the field-effect transistor 912 and the current through the IGBT or semiconductor switch 20 are shown in FIG. 4. First, at the time $t_{-1}$, the mechanical contact arrangement 30 is closed again, while the mechanical contact arrangement 10 is still open. Therefore, no load current flows through the switched pole. The contact bounce 100 that usually occurs when the contact arrangement 30 closes causes corresponding fluctuations or even drops 106 in the voltage potential X, which stop after the contact bounce has ended, so that the voltage potential X can return to its corresponding value when the switching path or the pole is open. The contact arrangement 10 is then closed with a delay at the time to. The contact bounce 102 that usually occurs during this closing operation in turn causes corresponding fluctuations or even drops 106 in the voltage potential X. The load current $I_L$ begins to flow from the time to.

In contrast to the course of the load current $I_L$ shown in FIG. 3, however, at the time to during the closing operation of the contact arrangement 10, the semiconductor switch 20 connected in parallel with it is closed, so that the current flow of the load current can commutate on the semiconductor switch 20. The semiconductor switch 30 remains closed until the contact bounce 102 has subsided and the contact arrangement 10 is stably closed. Therefore, there are generally no or at least only very slight drops in the current flow of the load current $I_L$ during the closing of the contact arrangement 10, as can be seen from the profile of the load current $I_L$.

The control of the IGBT or semiconductor switch 20 is carried out in the circuit arrangement shown in FIG. 1 via the control circuit 90 as follows: the closing operation of the (disconnect) contact arrangement 30 at the time $t_{-1}$ has the effect that the load voltage, which was previously present across the entire switching path comprising the two contact arrangements 10, 30, is now present across the still open (erase) contact arrangement 10.

At the IGBT or semiconductor switch 20, which was in the blocking state up to this point in time, the blocking state is maintained when the (disconnect) contact arrangement 30 is closed until the (erase) contact arrangement 10 is first mechanically contacted. When the (erase) contact arrangement 10 closes, the load voltage present across this contact pair also disappears, i.e. the voltage potential X drops approximately to zero, which is associated with a signal for the IGBT control or switching electronics system 50 in such a way that the semiconductor switch 20, for example, is switched into the conductive state with a delay of about 100 microseconds after contacting, as shown by the drive voltage $U_{Gate}$ of the IGBTs of the semiconductor switch 20 in FIG. 4. The delay is brought about here by the control circuit 90 and in particular by the low-pass filter contained therein. The control circuit 90 also ensures that the switching electronics system 50 is controlled on the input side with a suitable signal.

With the reopening of the (erase) contact arrangement 10 as a result of the bouncing process, the load current can then commutate immediately to the switched-through IGBT of the semiconductor switch 20, where it is conducted (see current $I_{IGBT}$ in FIG. 4) until reconnection of the erase contacts occurs and the current can flow through the mechanical contacts. When bounce-back occurs again, the load current is again taken over by the IGBT of the semiconductor switch 20. This commutation operation continues until permanent contact has been made. After a safe time interval $\Delta t$ from the first contact, the IGBT of the semiconductor switch 20 is then switched back into the blocking state.

With a view to the longest possible electrical service life of the IGBTs of the semiconductor switch 20 and their reasonably large dimensions, it is advisable to limit the current flow through the semiconductor switch 20 in terms of time in such a way that the current only flows there until the mechanical switching path has come to a complete stop due to conclusion of the mechanical bouncing operation. In order to minimize the current flow time through the semiconductor switch 20, precise knowledge of the time of the first commutation is important, since in each switching device the effective times for the mechanical connection operation fluctuate for various reasons.

The time of commutation to the already controlled IGBT of the semiconductor switch 20 can be detected by a current converter 60 located there (FIG. 1). The current converter 60 generates a signal as soon as a current begins to flow through the IGBTs of the semiconductor switch 20, that is to say the current flow commutates from the first mechanical contact arrangement 10 to the semiconductor switch 20. The signal generated by the current converter 60 and signaling the commutation is supplied to the switching electronics system 50, which, depending on this, can control the semiconductor switch 20 as described below.

Immediately after commutation has taken place, the switching electronics system 50 can control the semiconductor switch 20 in such a way that the IGBTs of the semiconductor switch 20 become blocking again after a short current flow time or current conducting time (for example the time period $\Delta t$) defined or specified via the switching electronics system 50, so that the commutated load current in the semiconductor switch 20 is led to zero within the defined time period $\Delta t$ and the current load on the IGBTs of the semiconductor switch 20 is limited. The current flow time is ideally dimensioned via the switching electronics system 50 in such a way that the switching path with the first and second mechanical contact arrangements 10 and 30 is completely closed, i.e. the switching contacts are permanently contacted and possible switching bouncing operations no longer occur.

The signal from the current transformer 60 can also be evaluated by the switching electronics system 50, and as soon as it is signaled that the current flow via the semiconductor switch 20 is decreasing again or is approximately zero as at time $t_3$, since the switching contacts of the two mechanical contact arrangements 10 and 30 are now permanently contacted and the switching contacts no longer bounce, the switching electronics system 50 can block the IGBTs of the semiconductor switch 20 again and interrupt the current flow via the semiconductor switch 20, which can take place before the time period $\Delta t_1$ has elapsed.

By equipping the semiconductor switch 20 with an antiserial IGBT, such a switching arrangement can be used both for DC currents with any direction of current flow and for alternating voltages of different frequencies, wherein the switching time is not dependent on the phase angle due to the independent supply of the control module.

During the switch-off operation in the semiconductor switch 20, high dI/dt values occur at high currents, as a result of which voltage peaks significantly above 1 kV can occur. To protect against such voltage peaks, it is expedient to connect a protective element, for example in the form of a varistor 70 (FIG. 1), to the semiconductor switch 20 or to connect it in parallel.

In summary, the voltage state of the erase contact arrangement is monitored and the timing control of the semiconductor switch is dependent on this. The monitoring of the voltage state is not a voltage measurement in the conventional sense, but in principle is a type of event detection, i.e. when the voltage at the erase contact arrangement drops, the timing control of the semiconductor switch is triggered. With the closing of the disconnect contact arrangement and the resulting rise in voltage at the erase contact arrangement, the switch-on support is activated, but without the semiconductor switch already being actuated. Only with the subsequent closing of the erase contact and the resulting negative voltage edge is the semiconductor switch then switched on. The voltage signal (edge signal) serves as a timer for the exact physical contacting of the disconnect contact arrangement and the erase contact arrangement. This has the following advantages:

The semiconductor switch is actually only supplied with current during a contact removal during the closing operation of the erase contact arrangement. This corresponds to the lowest current load achievable with a given mechanical system.

All mechanical tolerances (stroke tolerances, friction, etc.) or tolerances caused by environmental influences (heat, installation position, etc.) can be almost completely eliminated.

An overlap of the closing of the semiconductor switch with the closing of the disconnect contact arrangement is excluded even if the disconnect contact arrangement leads a little. This means that the disconnect contact also switches on without arcing.

As explained above, the voltage detection on the disconnect contact arrangement essentially serves as a trigger for a time marker for activating or switching on the semiconductor switch and therefore does not have to be designed as a linear voltage measurement. Rather, the "voltage signal" is generated by dynamic detection (edge) using the capacitors in the "measuring circuit."

The implementations explained in the present description are particularly suitable for use in contactors, circuit breakers and motor circuit breakers, which are designed in particular for operation with direct currents and/or low-frequency currents. It enables the switching of high direct currents and low-frequency currents with a comparatively long electrical service life, since long arcing times as well as a long current load on the semiconductor switch can be avoided. Furthermore, these properties allow the implementation of comparatively compact switching devices for high currents.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A switching apparatus for carrying and disconnecting electric currents, comprising:
   a first mechanical contact arrangement;
   a second mechanical contact arrangement which is connected in series with the first mechanical contact arrangement;
   a semiconductor switch which is connected in parallel to the first mechanical contact arrangement;
   a switching electronics system configured to switch on and switch off the semiconductor switch; and
   a control circuit configured to ascertain a voltage across the first mechanical contact arrangement as an ascertained voltage and to generate an actuation signal for the switching electronics system, which actuation signal switches on the semiconductor switch, depending on the ascertained voltage,
   wherein the switching apparatus is configured such that during a switching process the two mechanical contact arrangements are closed with a time delay in relation to one another,
   wherein the control circuit comprises a switch and a low-pass filter connected upstream of the switch, and wherein the switch is configured to generate the actuation signal for the switching electronics system.

2. The switching apparatus according to claim 1, wherein the control circuit is configured to generate the actuation signal for the switching electronics system when the control circuit determines a drop in the voltage present across the first mechanical contact arrangement.

3. The switching apparatus according to claim 2, wherein the control circuit is configured to generate the actuation signal for the switching electronics system when the determined voltage falls below a predetermined threshold value.

4. The switching apparatus according to claim 1, wherein the control circuit is configured to generate the actuation signal for the switching electronics system such that the semiconductor switch is switched on after a predetermined period of time.

5. The switching apparatus according to claim 4, wherein the predetermined time period is selected depending on a mechanical switch-on behavior of the first mechanical contact arrangement and/or on a current carrying capacity of the semiconductor switch.

6. The switching apparatus according to claim 4, wherein the semiconductor switch is switched off after a contact bouncing phase of the first mechanical contact arrangement.

7. The switching apparatus according to claim 4, wherein the predetermined period of time is about 100 µs.

8. The switching apparatus according to claim 1, wherein the control circuit comprises a Zener diode connected in parallel with a capacitor of the low-pass filter.

9. The switching apparatus according to claim 1, wherein the control circuit comprises a resistor which is connected in parallel with a capacitor of the low-pass filter and which forms a voltage divider with a resistance of the low-pass filter to generate an input voltage suitable for controlling the switch.

10. The switching apparatus according to claim 1, wherein the switch comprises a normally-blocking field-effect transistor, a load path of which is connected in series with a third resistor in parallel with the switching electronics system between a supply voltage and the reference potential, and wherein the control circuit is supplied with a voltage potential on an input side for control purposes.

11. A switching device, comprising:
the switching apparatus according to claim 1; and
a switching drive configured to move contacts of the first mechanical contact arrangement and second mechanical contact arrangement.

* * * * *